(12) United States Patent
Goldbach et al.

(10) Patent No.: US 7,199,414 B2
(45) Date of Patent: Apr. 3, 2007

(54) STRESS-REDUCED LAYER SYSTEM FOR USE IN STORAGE CAPACITORS

(75) Inventors: Matthias Goldbach, Dresden (DE); Bernhard Sell, Dresden (DE); Annette Sänger, Dresden (DE)

(73) Assignee: Infineon Technologies AG, München (DE)

( * ) Notice: Subject to any disclaimer, the term of this patent is extended or adjusted under 35 U.S.C. 154(b) by 110 days.

(21) Appl. No.: 10/780,075

(22) Filed: Feb. 17, 2004

(65) Prior Publication Data
US 2004/0159873 A1    Aug. 19, 2004

Related U.S. Application Data

(62) Division of application No. 10/131,358, filed on Apr. 24, 2002, now abandoned.

(30) Foreign Application Priority Data
Apr. 24, 2001  (DE) ................ 101 20 053

(51) Int. Cl.
*H01L 27/108*  (2006.01)
*H01L 29/76*   (2006.01)
*H01L 29/94*   (2006.01)
*H01L 31/119*  (2006.01)

(52) U.S. Cl. ...................... 257/301; 257/310
(58) Field of Classification Search ........... 257/301, 257/304, 310; 438/243, 386
See application file for complete search history.

(56) References Cited

U.S. PATENT DOCUMENTS 5,866,452 A    2/1999  Willer et al.
(Continued)

FOREIGN PATENT DOCUMENTS

DE    44 28 195 C1    4/1995
(Continued)

OTHER PUBLICATIONS

K. Yamada et al.: "A Deep-Trenched Capacitor Technology For 4 Mega Bit Dynamic RAM", Proceedings of International Devices and Materials, IEDM 85, 1985, pp. 702-705.

*Primary Examiner*—Hoai Pham
(74) *Attorney, Agent, or Firm*—Laurence A. Greenberg; Werner H. Stemer; Ralph E. Locher

(57) ABSTRACT

The stress-reduced layer system has at least one first layer of polycrystalline or single-crystal semiconductor material, which adjoins a microcrystalline or amorphous, conducting or insulating second layer. The semiconductor layer is doped with at least two dopants of the same conductivity type, of which at least one is suitable for reducing mechanical stresses at the interface. The stress-reduced layer system, in a further embodiment, has at least one first layer of semiconductor material, conducting or insulating material and at least one conducting or insulating second layer. A further semiconductor layer, which is doped with at least one dopant that is suitable for reducing mechanical stresses at the interface between the second layer and the first layer, is arranged between the first layer and the second layer or it is applied to the surface of the first layer or the second layer that is opposite from the interface.

5 Claims, 12 Drawing Sheets

U.S. PATENT DOCUMENTS

| | | |
|---|---|---|
| 5,905,279 A | 5/1999 | Nitayama et al. |
| 5,913,125 A | 6/1999 | Brouillette et al. |
| 6,180,480 B1 | 1/2001 | Economikos et al. |
| 6,265,741 B1 | 7/2001 | Schrems |
| 6,335,238 B1 * | 1/2002 | Hanttangady et al. ...... 438/240 |
| 6,552,380 B1 * | 4/2003 | Sato et al. .................. 257/301 |
| 2002/0171099 A1 | 11/2002 | Sato et al. |

FOREIGN PATENT DOCUMENTS

JP  2000-269462  9/2000

* cited by examiner

STRESS-REDUCED LAYER SYSTEM FOR USE IN STORAGE CAPACITORS

CROSS-REFERENCE TO RELATED APPLICATION

This is a division of U.S. application Ser. No. 10/131,358, filed Apr. 24, 2002 now abandoned.

BACKGROUND OF THE INVENTION

Field of the Invention

The present invention relates to a stress-reduced layer system with at least one polycrystalline or single-crystal semiconductor layer and at least one microcrystalline or amorphous conducting or insulating layer.

Layer systems of this type may, for example, comprise silicon-dielectric or silicon-metal or dielectric-metal stacks. Stacks of this type are usually produced by, for example, applying a dielectric or metal layer to a silicon substrate or a semiconductor or dielectric layer, typically using a CVD process.

In layer systems of this type without stress reduction, the problem usually occurs that, on account of the different lattice constants and the different coefficients of thermal expansion of the materials both at the interface and in the bulk, considerable mechanical stresses are generated. These stresses must not become too great, since in the event of a tensile stress the layer which is applied becomes detached from the other layer, while in the event of a compressive stress defects are produced in the material located below the applied layer.

In general, a distinction is drawn between bulk stress and interfacial stress. Bulk stress is produced by the lattice stress which is caused during doping when the doping atoms are incorporated into the crystal lattice on account of the different atomic radii of doping atoms and the material that is to be doped. Interfacial stress is formed at an interface between two layers on account of the different lattice constants and expansion coefficients of the two layer materials or, in the case of amorphous materials, only as a result of the expansion coefficients.

An example in which this problem leads to considerable restrictions in the choice of material relates to trench capacitors in DRAM memory cells.

A memory cell of this type comprises a read-out transistor and a storage capacitor. The information is stored in the storage capacitor in the form of an electric charge which represents a logic 0 or 1. This information can be read out via a bit line by driving the read-out transistor via a word line. To reliably store the charge and, at the same time, to allow differentiation of the information which is read out, the storage capacitor must have a minimum capacitance. The lower limit for the capacitance of the storage capacitor is currently regarded as being 25 fF.

Since the storage density increases from memory generation to memory generation, the surface area required by the single-transistor memory cell has to be reduced from generation to generation. At the same time, the minimum capacitance of the storage capacitor has to be retained.

Up to the 1 Mbit generation, both the read-out transistor and the storage capacitor were produced as planar components. Beyond the 4 Mbit memory generation, a further reduction in area of the memory cell was achieved by means of a three-dimensional arrangement of read-out transistor and storage capacitor. One possibility is for the storage capacitor to be produced in a trench (cf. for example K. Yamada et al., Proc. Intern. Electronic Devices and Materials IEDM 85, pp. 702 ff). In this case, a diffusion region which adjoins the wall of the trench and a doped polysilicon filling which is located in the trench act as electrodes of the storage capacitor. The electrodes of the storage capacitor are therefore arranged along the surface of the trench. This increases the effective surface area of the storage capacitor, on which the capacitance is dependent, with respect to the space required for the storage capacitor at the surface of the substrate, which corresponds to the cross section of the trench. The packing density can be increased further by reducing the cross section of the trench. However, there are limits on the extent to which the depth of the trench can be increased, for technological reasons.

Currently, only a material that requires no appropriate stress matching, in particular polysilicon, is selected for the trench filling. However, these materials alone have an excessively high impedance for future applications in trench capacitors.

Examples which may be mentioned of low-impedance materials for the trench filling are metals, in particular metal silicides. A metal electrode of this type can be used as an upper and/or as a bottom electrode of the trench capacitor.

It has been proposed in a commonly assigned German patent application (DE 199 41 096.8, as yet unpublished), for the lower and/or upper capacitor electrode of a memory cell with select transistor and trench capacitor to be designed as a metallic electrode. In that case, the upper capacitor electrode may also comprise two layers—tungsten silicide and polysilicon.

Furthermore, U.S. Pat. No. 5,905,279 describes a memory cell having a storage capacitor, which is arranged in a trench, and a select transistor, in which the storage capacitor has a lower capacitor electrode, which adjoins a wall of the trench, a capacitor dielectric and an upper capacitor electrode, and the upper capacitor electrode comprises a conductive layer, in particular comprising WSi, TiSi, W, Ti or TiN.

However, a problem with the use of a metal electrode is the occurrence of mechanical stresses both at the interface between metal electrode and adjoining semiconductor layer and in the bulk. These stresses have to be minimized in order to construct an electrical device which is able to function.

Furthermore, U.S. Pat. No. 6,180,480 describes a method for the fabrication of a trench capacitor in which the trench, which has a high aspect ratio, is filled with a SiGe filling, as a result of first of all a SiGe layer being deposited over the wafer surface, and then a heat treatment step being carried out at a suitable temperature, during which step the SiGe layer melts, so that the trench is filled completely, without voids, with the SiGe filling.

A further example in which interfacial and bulk stress which occurs may lead to limits being imposed on the performance of the device is the high doping of semiconductor materials, for example the high doping of the silicon substrate during the fabrication of the lower capacitor electrode of a trench capacitor. More specifically, the lower capacitor electrode is currently formed by a highly doped (dopant concentration approximately $10^{19}$ $cm^{-3}$) silicon region. The high dopant concentration is limited by the interfacial stress which occurs between silicon substrate and capacitor dielectric.

SUMMARY OF THE INVENTION

It is accordingly an object of the invention to provide a stress-reduced layer system, an improved memory capacitor, and a memory cell, which overcomes the above-mentioned disadvantages of the heretofore-known devices and methods of this general type and which provides a layer system with at least one first layer of semiconductor material, conducting or insulating material, which adjoins a conducting or insulating second layer, in which the mechanical stresses at the interface are reduced.

It is a particular object of the present invention to provide an improved storage capacitor and a memory cell having a storage capacitor of this type.

With the foregoing and other objects in view there is provided, in accordance with the invention, a storage capacitor, in particular a capacitor for a DRAM memory cell, comprising:

a lower capacitor electrode, a storage dielectric, and an upper capacitor electrode;

at least one of said lower and upper capacitor electrodes being a conductive layer;

a doped layer of SiGe, SiC, or GaAs, or a doped filling of SiGe, SiC, or GaAs disposed between said conductive layer and said storage dielectric, or disposed on a side of said conductive layer that is remote from said storage dielectric; and with the proviso that a doped SiGe layer is not disposed between said storage dielectric and said upper capacitor electrode.

In other words, the object is achieved by a storage capacitor, in particular for use in a DRAM memory cell, having a lower capacitor electrode, a storage dielectric and an upper capacitor electrode, at least one of the two capacitor electrodes being a conductive layer or filling, and a doped SiGe, SiC or GaAs layer or a doped SiGe, SiC or GaAs filling being arranged between the conductive layer or filling and the storage dielectric or on that side of the conductive layer which is remote from the storage dielectric, with the proviso that a doped SiGe layer is not arranged between the storage dielectric and the upper capacitor electrode.

The object is also achieved by a storage capacitor, in particular for use in a DRAM memory cell, having a lower capacitor electrode, a storage dielectric, and an upper capacitor electrode, the lower capacitor electrode being a conductive layer, and a doped Si layer being arranged between the conductive layer and the storage dielectric.

The present invention also provides a memory cell having a storage capacitor as defined above, which is designed as a trench capacitor, and a select transistor, which comprises a source electrode, a drain electrode, a gate electrode and a conductive channel, the upper capacitor electrode being electrically conductively connected to the source or drain electrode.

The present invention also provides a memory cell having a storage capacitor as defined above, which is designed as a stacked capacitor, and a select transistor, which comprises a source electrode, a drain electrode, a gate electrode, and a conductive channel, the lower capacitor electrode being applied to an electrically conductive connection structure and being electrically conductively connected to the source or drain electrode via this connection structure.

In the storage capacitor defined above, at least one capacitor electrode is a conductive layer or filling. It preferably contains metal, i.e. may, for example, be selected from metal silicide, metal nitride, metal carbide, WN, WSiN, WC, TiN, TaN or TaSiN.

The result is a stress-reduced layer system having at least one first layer of polycrystalline or single-crystal semiconductor material, which adjoins a microcrystalline or amorphous conducting or insulating second layer, the semiconductor layer being doped with at least two dopants of the same conductivity type, of which at least one is suitable for reducing mechanical stresses at the interface.

Furthermore, the result is a stress-reduced layer system having at least one first layer of semiconductor material, conducting or insulating material and at least one conducting or insulating second layer, a further semiconductor layer, which is doped with at least one dopant which is suitable for reducing mechanical stresses at the interface between the second layer and the first layer, being arranged between the first layer and the second layer or being applied to the opposite surface of the first layer or second layer from the interface.

The present invention is substantially based on the discovery that, as a result of the controlled introduction of impurities into a semiconductor layer, mechanical stresses at an interface between semiconductor layer and conducting or insulating layer or between conducting and insulating layer are reduced. The impurities have to be selected in such a manner that the mechanical properties are modified in a suitable way, while the electrical properties are retained in such a manner that a fully functional electrical component remains possible.

More precisely, impurities which produce a mechanical prestressing of the polycrystalline or single-crystal layer are introduced into the semiconductor layer. The impurities can be introduced into the first semiconductor layer, which forms the interface with the second layer. However, it is also possible, optionally in addition, for a further semiconductor layer, which is doped with a suitable impurity, to be applied. This semiconductor layer may then be arranged between the first and second layers or may be applied to the opposite surface of the first layer or the second layer from the interface. This makes it possible for the interfacial and bulk stresses to be optimized substantially separately from one another.

By way of example, compressible mechanical stresses can be produced in p-doped silicon by the doping with Al, Ga, In, Tl or by the use of SiGe as transition layer with corresponding dopants, for example Al, Ga, In, Tl, B. By contrast, tensile mechanical stresses can be achieved by B-doping or by SiC with suitable dopants, for example Al, Ga, In, Tl, B. In this case, both the type of dopant and its concentration are of importance to the setting of the stress. In n-doped silicon, compressible mechanical stresses can be produced by the dopants As, Sb or by the use of a SiGe transition layer with corresponding dopants, for example As, Sb, P. Tensile mechanical stresses can be achieved by phosphorus doping of silicon or by SiC as transition layer together with the corresponding dopants, in particular As, Sb and P.

Naturally, it is also possible for other impurities to be used as dopant, provided that they do not undesirably impair the electrical functionality.

The interfacial stress may in this case occur between a semiconductor layer, for example a polycrystalline or single-crystal semiconductor material, in particular single-crystal or polycrystalline silicon, and a single-crystal, microcrystalline or amorphous insulating layer. Insulating layers which can be used are in particular the amorphous materials $Si_3N_4$, $SiO_2$, SiON, $Al_2O_3$, $Al_2O_3$ together with additions of Hf, Zr, Y and La, and the single-crystal materials $Pr_2O_3$, $Nd_2O_3$. However, the interfacial stress may also occur between a semiconductor layer as mentioned above and a microcrystalline or amorphous conducting layer, such as for example metal nitride, metal silicide, metal carbide and in particular WN, WSiN, WC, TiN, TaN, TaSiN.

Materials which can be used for the further semiconductor layer, which is doped with a suitable dopant as mentioned above, are in particular polycrystalline or single-crystal silicon, GaAs, SiGe and SiC.

If polycrystalline silicon is doped with a corresponding dopant, it is possible, in addition to the abovementioned possibilities for crystalline silicon, in addition to select firstly suitable deposition conditions, such as for example temperature or pressure, and secondly suitable subsequent heat treatments in order to adapt the stresses in a suitable way.

If a spatially varying doping profile is selected in one layer, the advantage ensues that it is possible both to adapt the stresses at the interface and to reduce the stresses in the bulk.

The present invention may in particular be applied advantageously to trench capacitors or stacked capacitors for use in DRAM memory cells.

By way of example, it may be applied to a memory cell having a storage capacitor, which is designed as a trench capacitor, and a select transistor, which has source, drain and gate electrodes and a conducting channel. The trench capacitor comprises a lower capacitor electrode, a storage dielectric and an upper capacitor electrode, which are arranged at least partially in a trench. The upper capacitor electrode is connected to the source or drain electrode of the select transistor. The lower capacitor electrode may, for example, be formed by a highly doped semiconductor region, the stress which occurs between highly doped semiconductor region and storage dielectric being reduced by the fact that the semiconductor layer is doped with at least two dopants of the same conductivity type, of which at least one is suitable for reducing mechanical stresses at the interface.

Alternatively, the lower capacitor electrode may be a conductive layer, and a further semiconductor layer, which is doped with at least one dopant which is suitable for reducing mechanical stresses at the interface between the dielectric layer and the conductive layer, is arranged between the conductive layer and the dielectric layer or is applied to the opposite surface of the conductive layer from the interface. In particular, a suitably doped polysilicon layer may be provided between the conductive layer and the dielectric layer.

The upper capacitor electrode may, for example, comprise a combination of a conductive layer, in particular a tungsten silicide layer, and a suitably doped silicon-germanium filling. The stress which occurs between the storage dielectric and the conductive layer is reduced by the suitably doped SiGe filling. This design of the upper capacitor electrode can be applied to a trench capacitor with any desired form of the lower capacitor electrode.

However, the invention may also be applied to a memory cell having a storage capacitor, which is designed as a stacked capacitor, and a select transistor, which has source, drain and gate electrodes and a conductive channel. The stacked capacitor comprises a lower capacitor electrode, which is applied to an electrically conductive connection structure and is connected to the source or drain electrode of the select transistor via this connection structure, and a storage dielectric and an upper capacitor electrode. The lower capacitor electrode may be formed from a conductive material, for example tungsten silicide, and the stress which occurs between storage dielectric and lower capacitor electrode is reduced by the fact that the electrically conductive connection structure is formed from suitably doped silicon-germanium.

The present invention therefore provides the following advantages:

The stress between layers which are applied on top of one another is reduced. Consequently, layer detachment and/or the formation of defects, which in turn leads to the electrical properties of the component being impaired, can be avoided.

The fact that there is a simple possibility of reducing the stress increases the choice of materials. For example, it is now possible to use low-impedance materials for capacitor electrodes, which could not have been used without stress matching.

Other features which are considered as characteristic for the invention are set forth in the appended claims.

Although the invention is illustrated and described herein as embodied in a stress-reduced layer system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
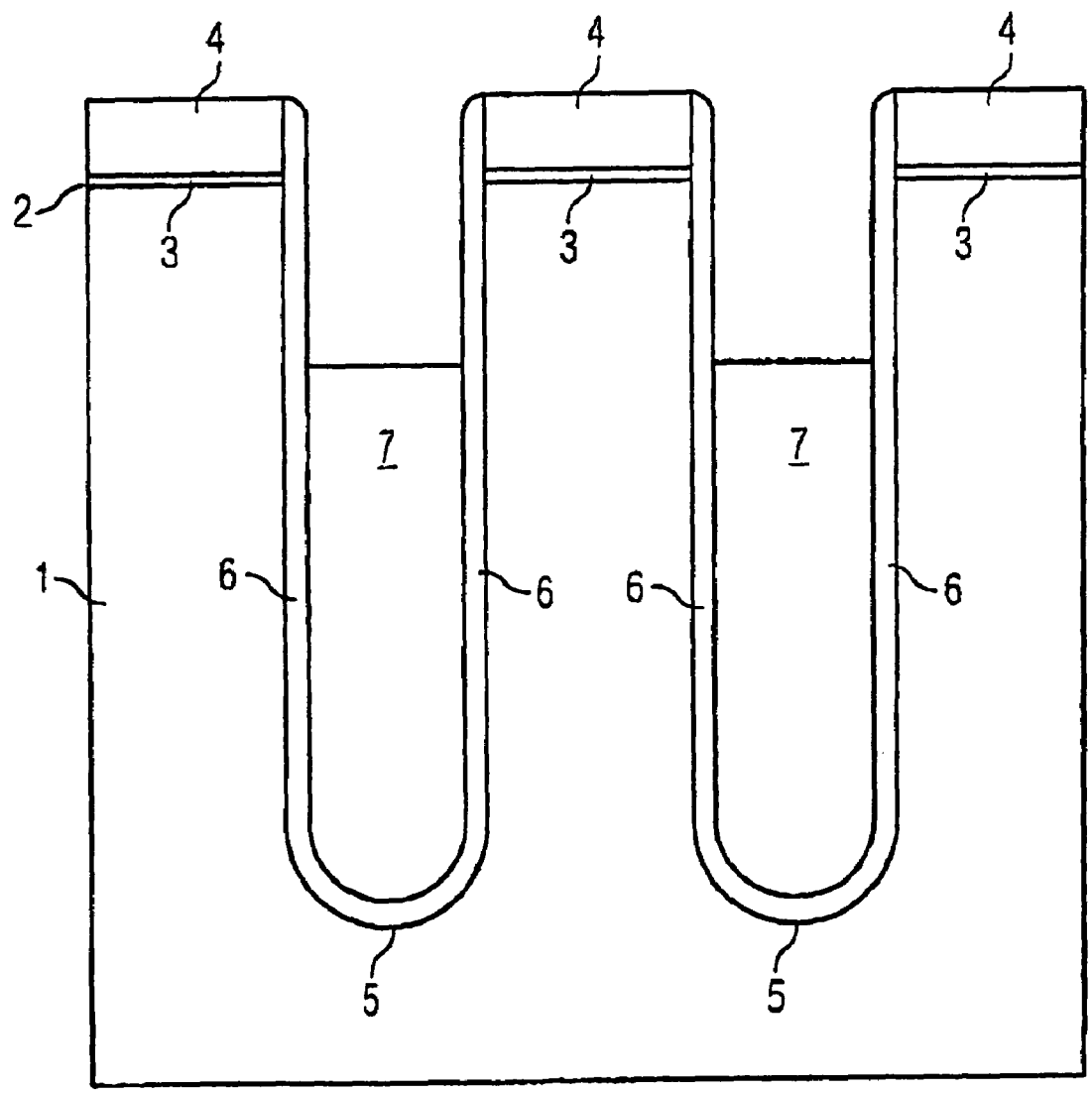
FIGS. 1 to 4 are diagrammatic sectional side views illustrating the steps involved in forming a memory cell, in which the lower capacitor electrode comprises a stress-reduced layer system.
Figure 2:
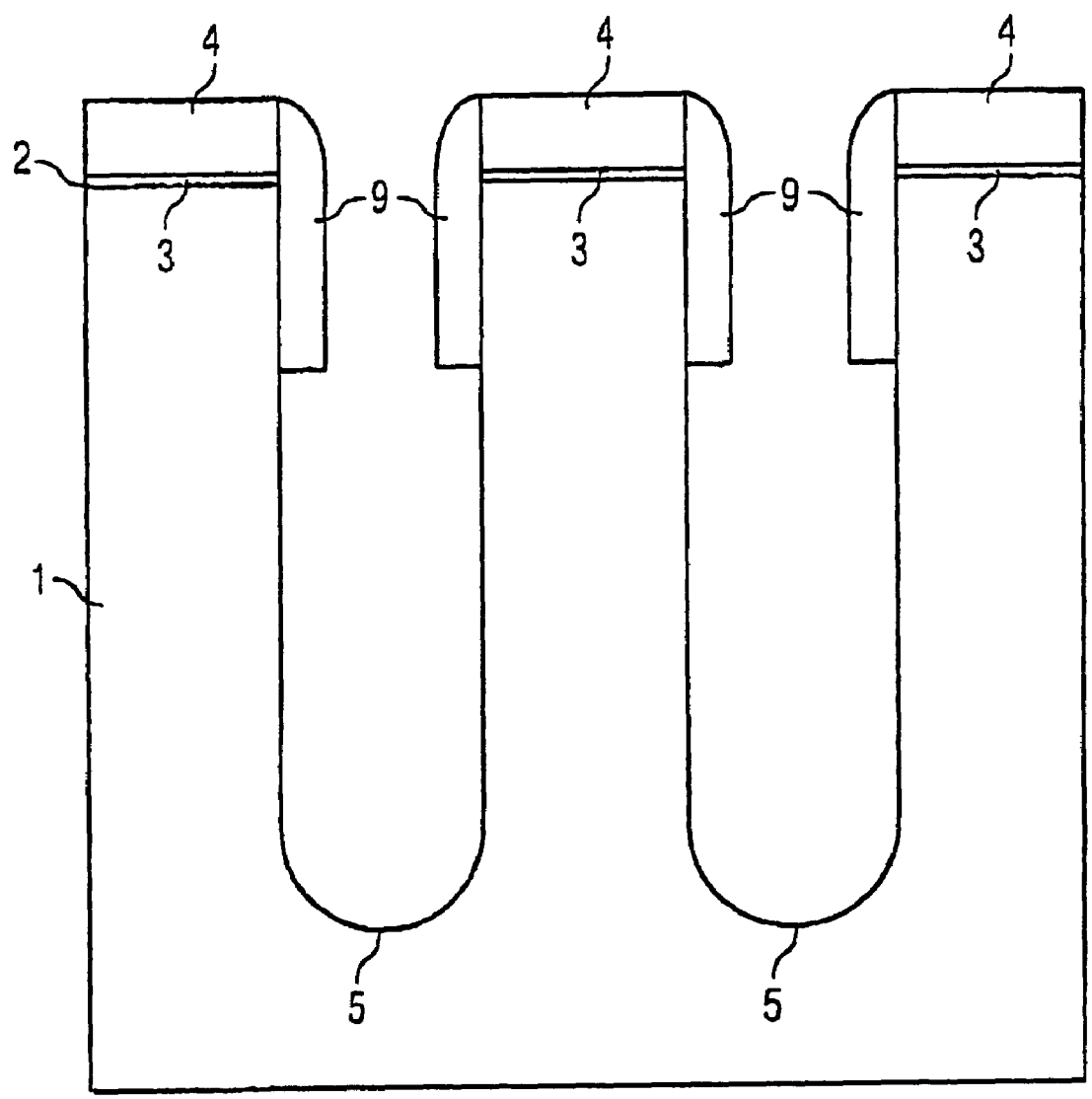

Referring now to the figures of the drawing in detail and first, particularly, to FIGS. 1–4 thereof, there is described a first exemplary embodiment, in which the stress reduction is achieved by doping the semiconductor layer with at least two dopants of the same conductivity type. Stress reduction of this type can advantageously be used when forming the lower capacitor electrode of a trench capacitor, which is also referred to as a bottom electrode.

Step 1: Preparation and Etching of the Capacitor Trenches

In FIG. 1, a silicon substrate 1 is shown with a main surface 2. A 5 nm thick $SiO_2$ layer 3 and a 200 nm thick Si$_3$N$_4$ layer 4 are applied to the main surface 2. A non-illustrated 1000 nm thick BSG layer is then applied as hard mask material.

The BSG layer, the Si$_3$N$_4$ layer 4 and the SiO$_2$ layer 3 are patterned in a plasma etching process using CF$_4$/CHF$_3$ and a photolithographically produced mask, so that a hard mask is formed. After the photolithographically produced mask has been removed, trenches 5 are etched into the main surface 1 in a further plasma etching process using HBr/NF$_3$ and the hard mask as an etching mask. The BSG layer is then removed by wet etching using H$_2$SO$_4$/HF.

The trenches 5 have a depth, for example, of 5 μm, a width of 100×250 nm and are spaced apart by 100 nm.

Next, a 10 nm thick SiO$_2$ layer 6, which may also be doped, for example by in-situ doping, is deposited. The deposited SiO$_2$ layer 6 covers at least the walls of the trenches 5. By deposition of a 200 nm thick polysilicon layer, chemical mechanical polishing down to the surface of the Si$_3$N$_4$ layer 4 and by etching back the polysilicon layer using SF$_6$, a polysilicon filling 7 is produced in each of the trenches 5, the surface of which filling is arranged 1000 nm below the main surface 2 (cf. FIG. 1). If appropriate, the chemical mechanical polishing may be dispensed with. The polysilicon filling 7 is used as a sacrificial layer for the subsequent deposition of Si$_3$N$_4$ spacers. Then, the SiO$_2$ layer 6 is etched isotropically at the walls of the trenches 5.

Next, in a CVD process a 20 nm thick spacer layer 9, which comprises silicon nitride and/or silicon dioxide, is deposited and is etched in an anisotropic plasma etching process using CHF$_3$. The spacer layer 9 which has just been deposited serves as a covering material during the step of selective formation of the metal silicide on uncovered silicon regions. In the finished memory cell, it serves to disconnect the parasitic transistor which would otherwise form at this location, and therefore acts as the insulation collar.

Then, polysilicon is etched selectively with respect to Si$_x$N$_y$ and SiO$_2$, using SF$_6$. In the process, the polysilicon filling 7 is in each case completely removed from the trench 5. That part of the SiO$_2$ layer 6 which has now been uncovered is removed by etching with NH$_4$F/HF (cf. FIG. 2).

Then, if appropriate, to widen the trenches 5 in their lower region, i.e. in the region which is remote from the main surface 2, silicon is etched selectively with respect to the spacer layer. This is achieved, for example, by an isotropic etching step using ammonia, in which silicon is etched selectively with respect to Si$_3$N$_4$. The etching time is such that 20 nm of silicon are etched. As a result, the cross section is widened by 40 nm in the lower region of the trenches 5. As a result, the capacitor area and therefore the capacitance of the capacitor can be considerably increased.

The drawings illustrate the process sequence with unwidened trenches.

Step 2: Formation of the Lower Capacitor Electrode

There then follows the doping of the silicon substrate with P and As, with the result that an n$^+$-doped region 11 is formed. According to the present invention, an overall concentration of the dopants from 10$^{20}$ to 10$^{21}$ cm$^{-3}$ is particularly advantageous. The ratio of P atoms to As atoms is approximately 10:1 to 1:1.

The co-doping may take place by gas-phase doping using two gases that are admitted in succession and at different temperatures. The gas containing the dopant with the lower diffusion constant, i.e. the As-containing gas, is thereby admitted first. The gas containing the dopant with the greater diffusion constant, i.e. the P-containing gas, follows at a later stage.

However, it is also possible for a substrate which is doped, for example, with phosphorus additionally to be doped with As, for example by deposition of an arsenic-doped silicate glass layer in a layer thickness of 50 nm and a TEOS-SiO$_2$ layer in a thickness of 20 nm, followed by a heat treatment step at 1000° C., 120 seconds, with the result that a region 11 which is doped with arsenic and phosphorus is formed by outdiffusion from the arsenic-doped silicate glass into the phosphorus-doped silicon substrate 1.

Alternatively, the phosphorus-doped substrate may also, in addition, be doped with arsenic by gas-phase doping, for example using the following parameters: 900° C., 399 Pa tributylarsine (TBA) [33 percent], 12 min.

In the finished trench capacitor, the n$^+$-doped region 11 acts as the lower capacitor electrode. Furthermore, on account of its high doping, the depletion zone is reduced in size, with the result that the capacitance of the capacitor is further increased.

On account of the co-doping, it is possible for the n$^+$-doped region 11 to be doped with a higher dopant concentration without stress forming as a result at the interface with the dielectric layer. Accordingly, the depletion zone can be made particularly small, with the result that the capacitance of the capacitor becomes particularly great.

Step 3: Deposition of the Capacitor Dielectric

Next, a 5 nm thick dielectric layer 14, which contains SiO$_2$ and Si$_3$N$_4$ and also, if appropriate, silicon oxynitride, is deposited as capacitor dielectric. This layer sequence can be produced by steps of nitride deposition and of thermal oxidation, during which defects in the layer below are annealed out. As an alternative, the dielectric layer 14 contains Al$_2$O$_3$ (aluminum oxide), if appropriate with an addition of Hf, Zr, Y or La, or alternatively Pr$_2$O$_3$ or Nd$_2$O$_3$.

Step 4: Formation of the Upper Capacitor Electrode

Figure 3:
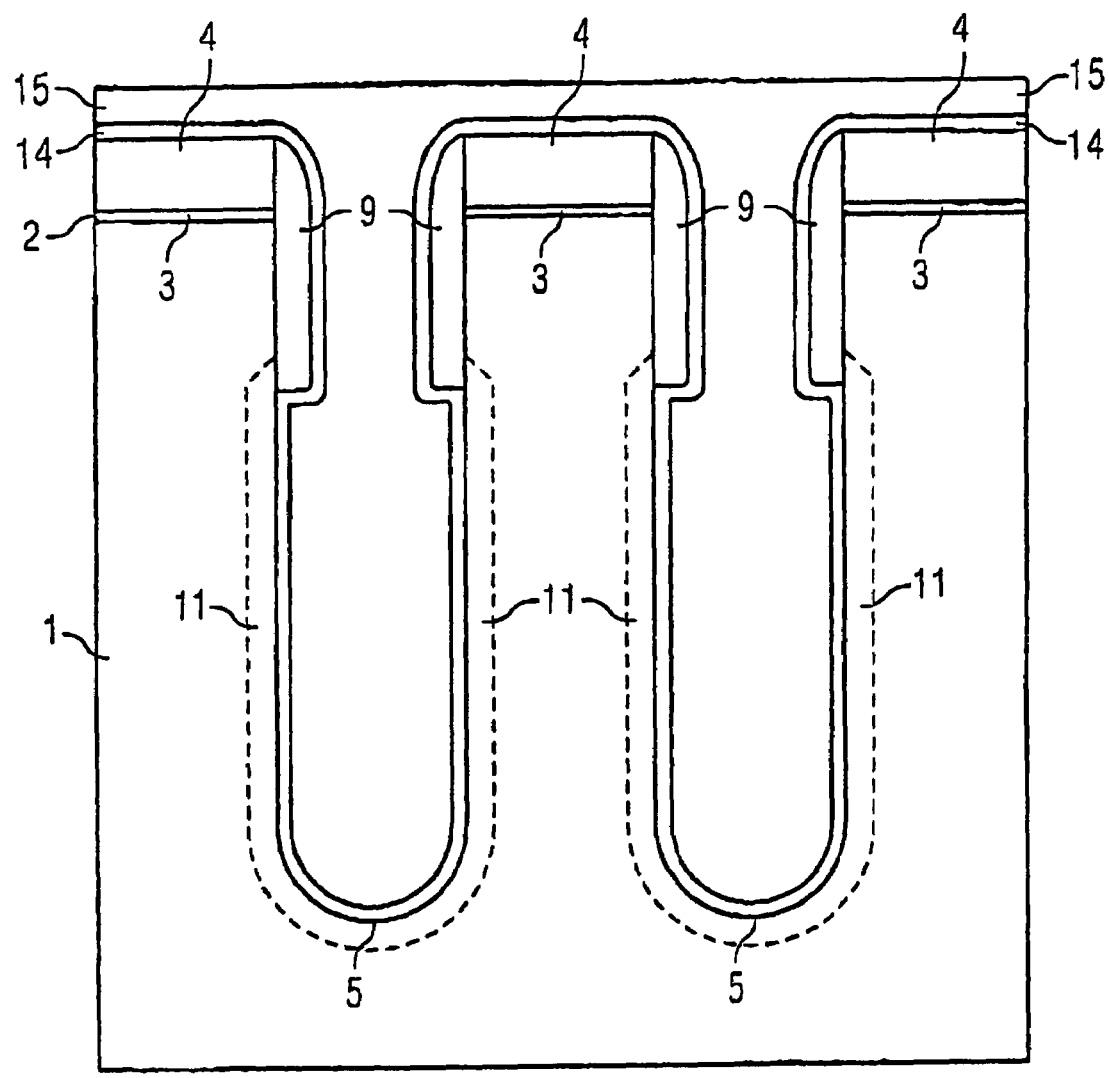

Then, the upper capacitor electrode is formed. By way of example, a 200 nm thick in-situ doped polysilicon layer 15 is deposited, as shown in FIG. 3. The polysilicon layer 15 and the dielectric layer 14 are removed down to the surface of the Si$_3$N$_4$ layer 4 by chemical mechanical polishing.

Step 5: Connection of the Upper Capacitor Electrode to the Select Transistor

Next, the standard DRAM process is carried out, by means of which the upper capacitor electrode is suitably patterned and is connected to the source/drain region of a select transistor.

Figure 4:
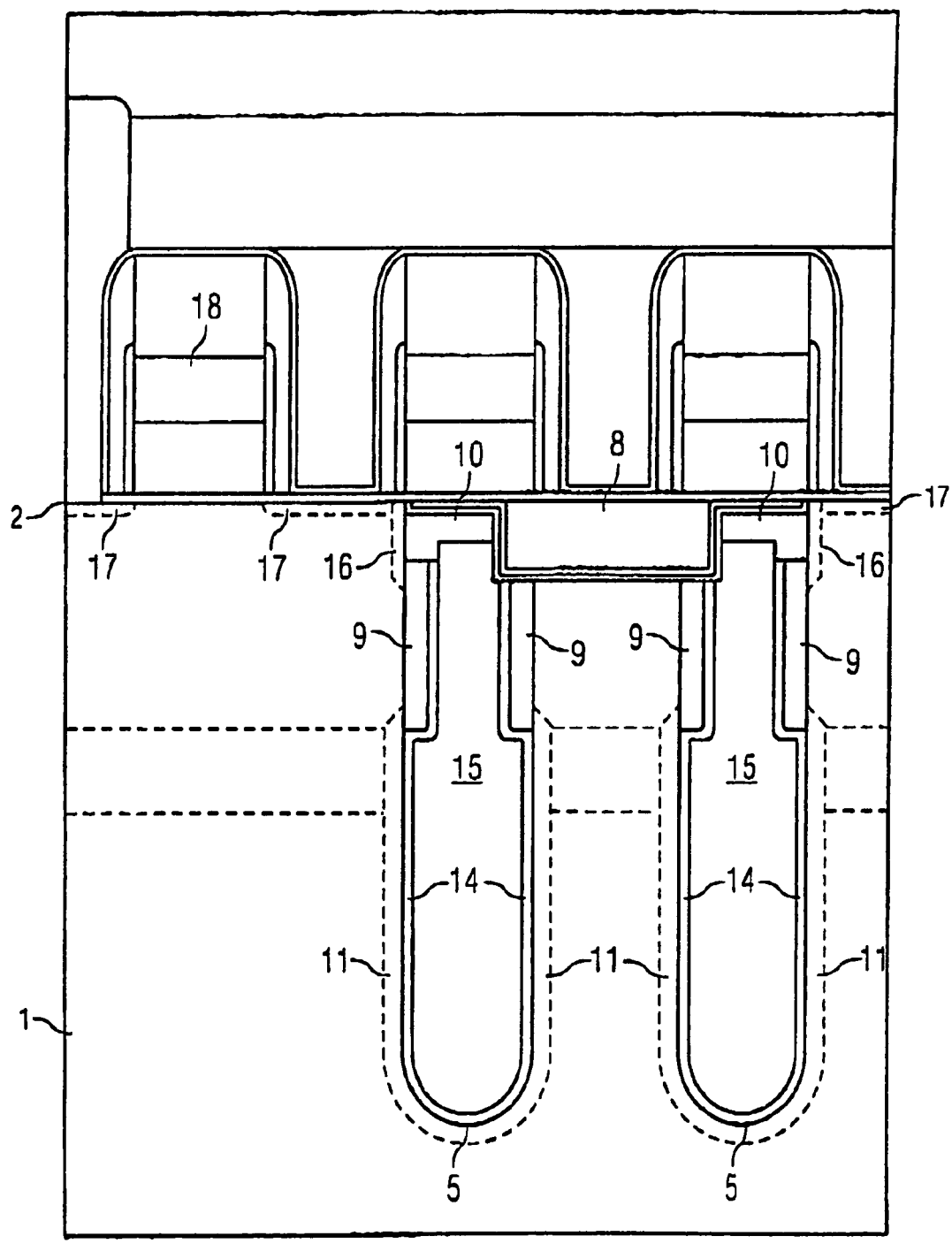

This can be achieved, for example, by etching the polysilicon filling 15 to approximately 100 nm below the main surface 2. This is followed by Si$_3$N$_4$ etching using HF/ethylene glycol, during which 10 nm of Si$_3$N$_4$ are etched, and etching using NH$_4$F/HF, by means of which SiO$_2$ and dielectric material are etched. After sacrificial oxidation to form a non-illustrated screen oxide, an implantation step is carried out, during which an n$^+$-doped region 16 is formed in the side wall of each trench 5 in the region of the main surface 2. As shown in FIG. 4, space which remained free above the polysilicon filling 15 in the respective trench 5 is filled with a polysilicon filling 10 by deposition of in-situ doped polysilicon and back-etching of the polysilicon using SF$_6$. In the finished storage capacitor, the polysilicon filling 15 acts as the upper capacitor electrode. The polysilicon filling 10 acts as a connection structure between the n⁺-doped region 16 and the polysilicon filling 15 acting as the upper capacitor electrode.

Then, insulation structures 8 are produced, which surround the active regions and thereby define these regions. For this purpose, a mask which defines the active regions and is not shown, is formed. The insulation structures 8 are completed by nonselective plasma etching of silicon, $SiO_2$ and polysilicon with the aid of $CHF_3/N_2/NF_3$, the etching time being set in such a way that 200 nm of polysilicon are etched, by removing the resist mask used by means of $O_2/N_2$, by wet-chemical etching of 3 nm of dielectric layer, by oxidation and deposition of a 5 nm thick $Si_3N_4$ layer and by deposition of a 250 nm thick $SiO_2$ layer in a TEOS process and subsequent chemical mechanical polishing. Then, the $Si_3N_4$ layer 4 is removed by etching in hot $H_3PO_4$, and the $SiO_2$ layer is removed by etching in dilute hydrofluoric acid.

Next, a screen oxide is formed by sacrificial oxidation. Photolithographically produced masks and implantations are used to form n-doped wells, p-doped wells and to carry out threshold voltage implantations in the region of the periphery and of the select transistors of the cell array. Furthermore, high-energy ion implantation is carried out for doping of the substrate region which is remote from the main surface 2. In this way, an n⁺-doped region, which connects adjacent lower capacitor electrodes 13 to one another, is formed (known as a buried-well implant).

Then, the transistor is completed by generally known method steps, by defining in each case the gate oxide and the gate electrodes 18, corresponding interconnects and the source and drain electrodes 17.

Then, the memory cell is completed in a known way by forming further wiring levels.

Figure 5:
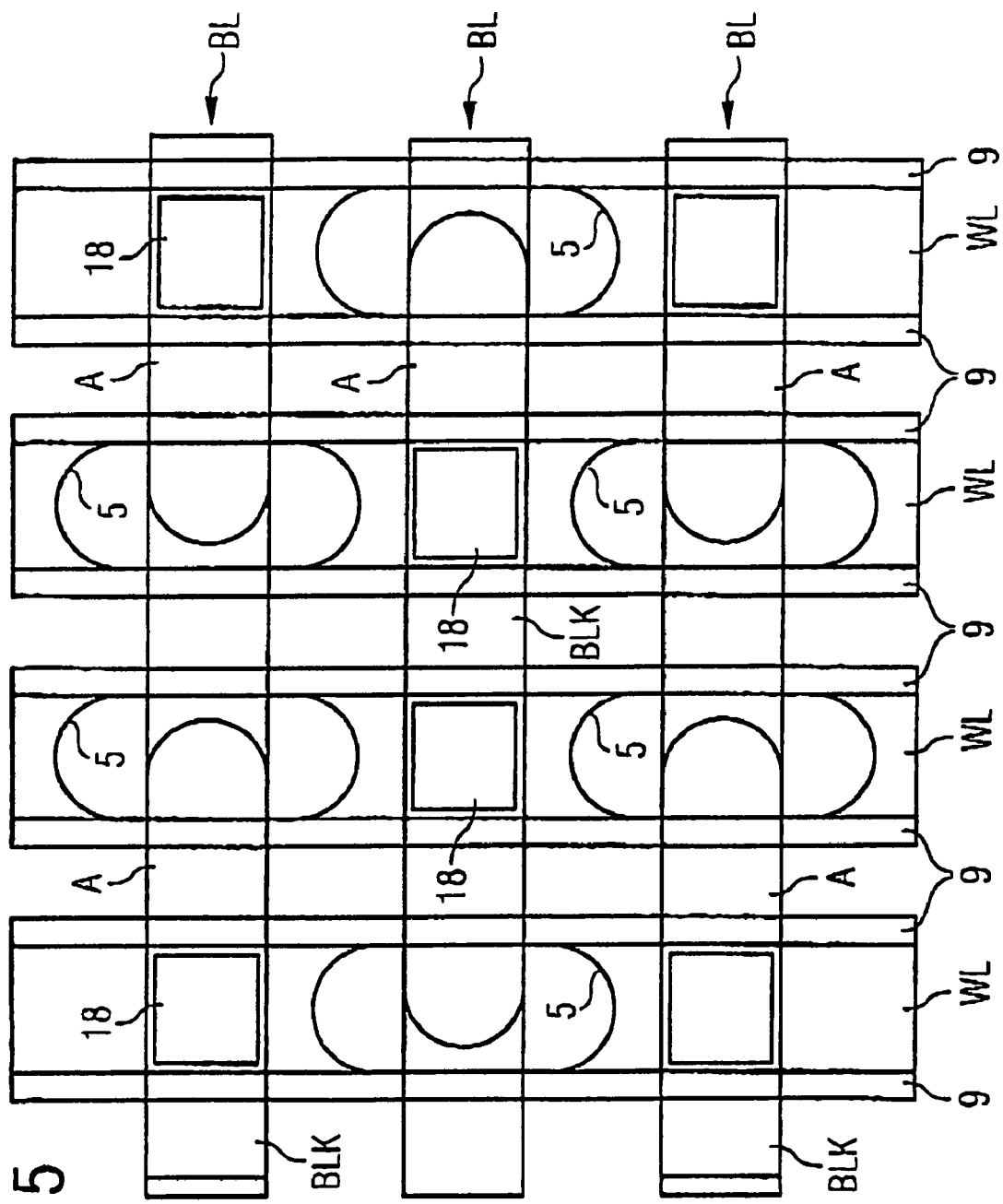
FIG. 5 is a plan view showing a layout in an $8F^2$ cell architecture.

The memory cell arrangement, the layout of which is illustrated for an 8-$F^2$ cell architecture, by way of example, in FIG. 5, has for each memory cell a storage capacitor arranged in one of the trenches 5 and a planar select transistor. Each memory cell requires a space of $8F^2$, where F is the minimum feature size in the respective technology. The bit lines BL run in strip form and parallel to one another, the width of the bit line BL being in each case F, and the distance between the bit lines likewise being F. The word lines WL, which likewise have a width of F and are spaced apart by F, run perpendicular thereto. Below the bit lines BL there are active regions A, two word lines WL crossing above each active region. The active regions A are in each case arranged offset with respect to one another below adjacent bit lines BL. A bit line contact BLK, which allows electrical connection between the respective bit line BL and the active region A, is arranged in the center of the active regions A. The trenches 5 are arranged below the word line WL. The gate electrode 26 of the associated select transistor is arranged in each case within the active regions at the crossing point between one of the bit lines BL and one of the word lines WL.

The active regions A in each case extend between two trenches 5. They comprise two select transistors, which are connected to the associated bit line BL via a common bit line contact BLK. The information from the storage capacitor which is arranged in one or other of the trenches 5 is read out depending on which of the word lines WL is driven.

In a second exemplary embodiment, the lower capacitor electrode is produced by a layer stack comprising tungsten silicide and doped polysilicon which is applied to the silicon substrate.

First of all, as described in the first exemplary embodiment under step 1, the silicon substrate is prepared and the capacitor trenches are etched.

Step 2: Formation of the Lower Capacitor Electrode

First of all, if this has not already taken place by means of the doped oxide, the silicon substrate is doped. This can be achieved, for example, by deposition of an arsenic-doped silicate glass layer in a layer thickness of 50 nm and of a TEOS-$SiO_2$ layer in a thickness of 20 nm, followed by a heat-treatment step at 1000° C., 120 seconds, with the result that an n⁺-doped region 11 is formed by outdiffusion from the arsenic-doped silicate glass layer into the silicon substrate 1. Alternatively, gas-phase doping may also be carried out, for example using the following parameters: 900° C., 399 Pa tributylarsine (TBA) [33 percent], 12 min.

The goal of the n⁺-doped region 11 is to reduce the size of the depletion zone, so that the capacitance of the capacitor is increased further. Furthermore, the n⁺-doped region produces ohmic contact with the metal electrode which is yet to be fabricated.

Then, the metal electrode 13, which in the present exemplary embodiment consists of tungsten silicide, is applied. This can be achieved, for example, by deposition of tungsten silicide in the trench or alternatively by selective formation of tungsten silicide on the uncovered silicon regions. The thickness of the metal electrode is typically about 10 to 30 nm.

Then, an approximately 10 to 30 nm thick polysilicon layer 19, which is doped with arsenic in a concentration of $10^{19}$ to $10^{21}$ cm⁻³, is applied.

The role of the doped polysilicon interlayer 19 is to reduce the interfacial stress between the tungsten silicide layer and the dielectric layer which is yet to be applied.

Figure 6:
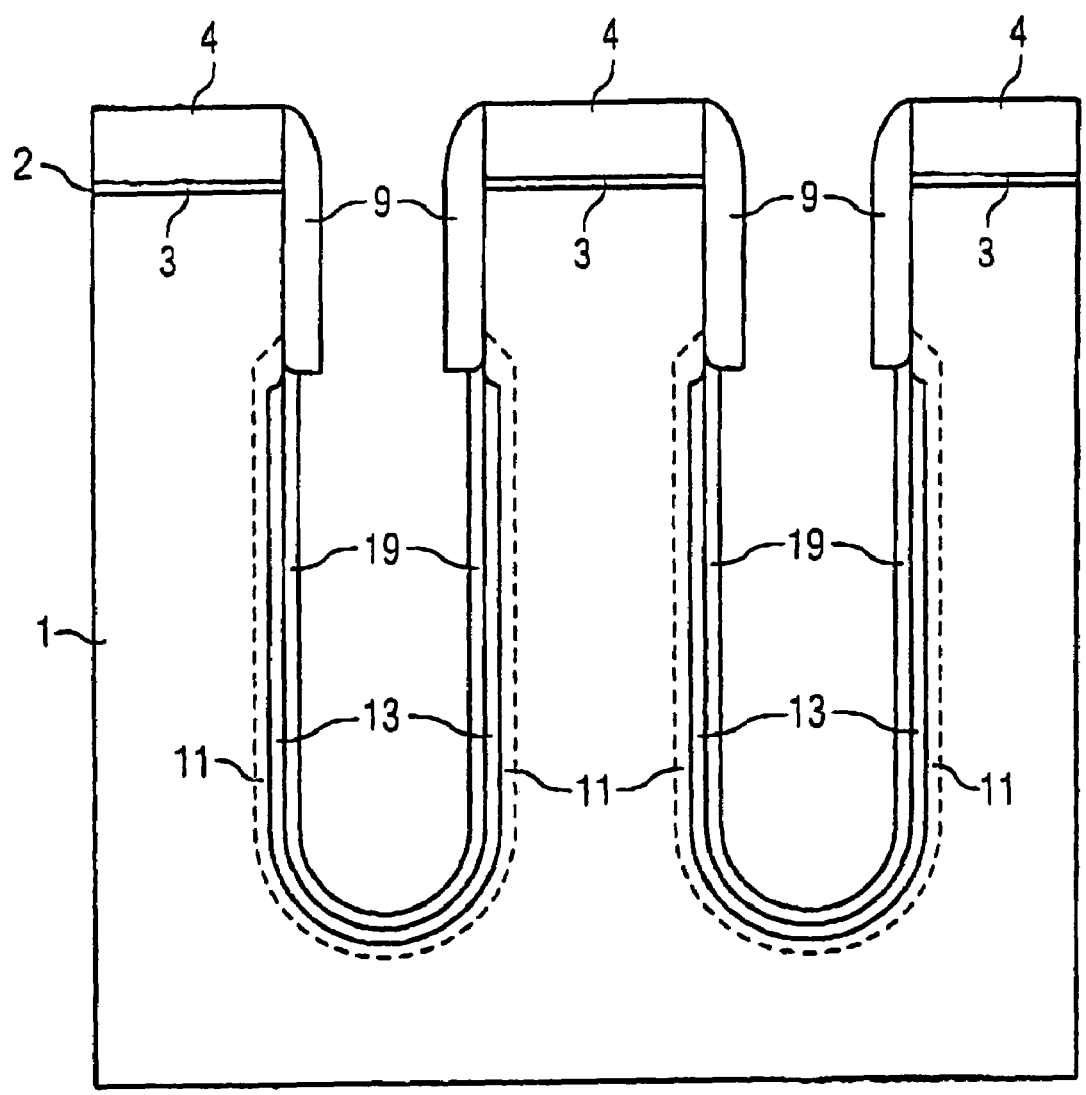
FIGS. 6 and 7 are side views illustrating the steps involved in forming a memory cell in which the lower capacitor electrode likewise comprises a stress-reduced layer system.

Then, the polysilicon interlayer 19 and, if appropriate, the tungsten silicide layer, if the latter has not been formed in self-aligned fashion on the uncovered silicon regions, are etched back. For this purpose, first of all a photoresist is introduced in the lower trench region, the height of the resist filling being set by etching using $N_2/O_2$, and anisotropic etching is carried out using $HCl/Cl_2/NF_3$, during which step tungsten silicide is etched selectively with respect to $Si_3N_4$ and $SiO_2$ (cf. FIG. 6).

It is therefore possible, according to the present invention, for the lower capacitor electrode to be designed as a metallic electrode, with the result that its conductivity is increased, and in addition for the capacitance to be increased, on account of the reduction in the size of the depletion zone. At the same time, the polysilicon interlayer 19 prevents adverse effects caused by stress between the lower capacitor electrode and the capacitor dielectric.

Figure 7:
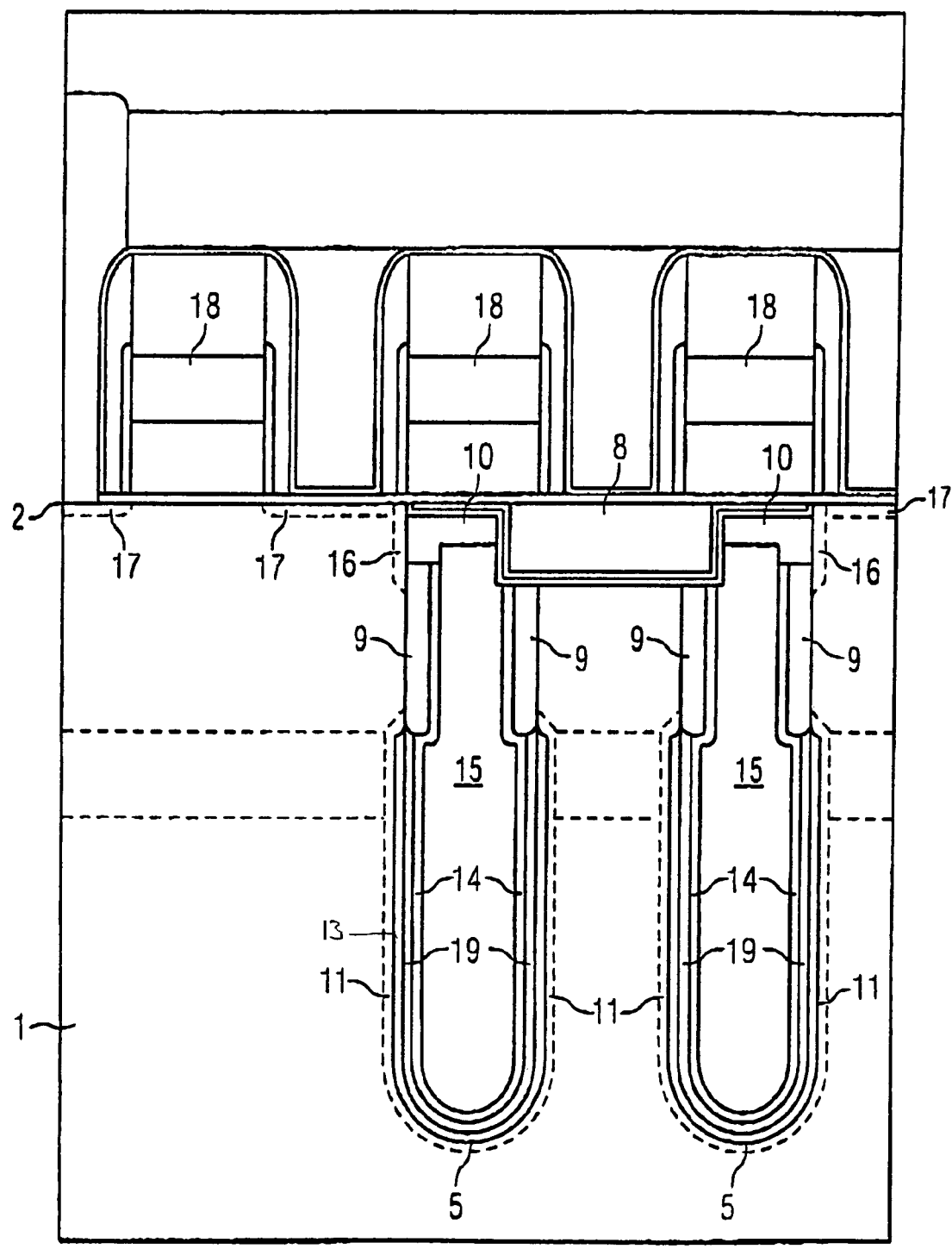

The trench capacitor and then the memory cell are completed by carrying out steps 3 to 5 which have been explained above in connection with the first exemplary embodiment (cf. FIG. 7).

According to a third exemplary embodiment of the present invention, the interfacial stress which occurs between an insulating layer and a conducting layer is reduced by means of a suitably doped SiGe layer which is applied to the conductive layer. This can advantageously be directed at the upper capacitor electrode of a trench capacitor.

Step 1 for preparation of the silicon substrate and for etching of the capacitor trenches is carried out in the same way as that which has been described with reference to the first exemplary embodiment.

Step 2: Formation of the Lower Capacitor Electrode

If this has not already been achieved by the doped oxide, the silicon substrate is doped. This can be achieved, for example, by deposition of an arsenic-doped silicate glass layer in a layer thickness of 50 nm and of a TEOS-SiO$_2$ layer in a thickness of 20 nm, followed by a heat treatment step at 1000° C., 120 seconds, with the result that an n$^+$-doped region 11 is formed by outdiffusion from the arsenic-doped silicate glass layer into the silicon substrate 1. Alternatively, gas-phase doping may also be carried out, for example using the following parameters: 900° C., 399 Pa tributylarsine (TBA) [33 percent], 12 min.

The role of the n$^+$-doped region is firstly to reduce the size of the depletion zone, with the result that the capacitance of the capacitor is increased further. Secondly, the high dopant concentration, which is of the order of magnitude of 10$^{19}$ cm$^{-3}$, can provide the lower capacitor electrode, if this is not metallic. If it is metallic, the high doping provides an ohmic contact.

Figure 8:
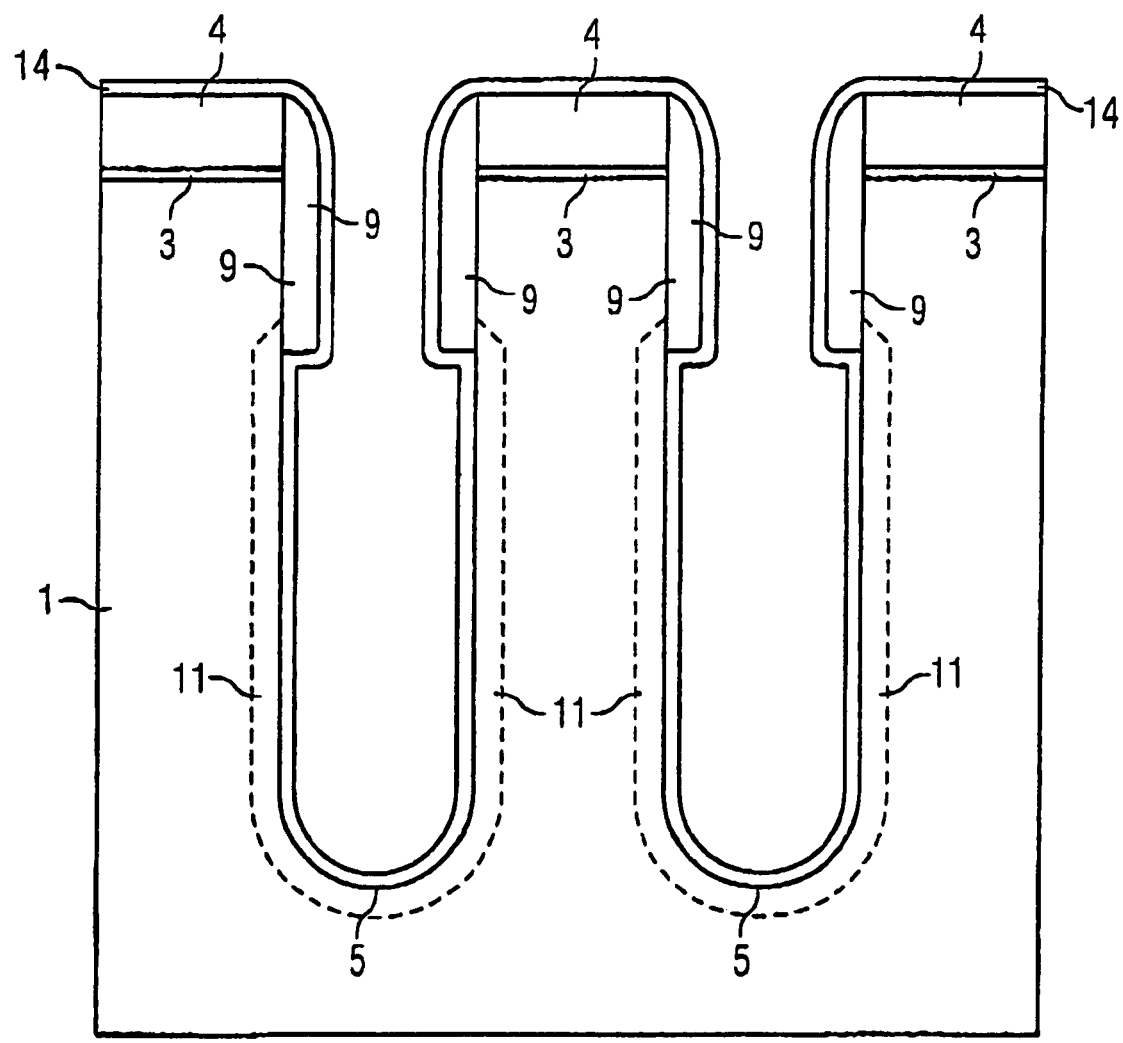
FIGS. 8 to 10 are side views illustrating the steps involved in forming a memory cell in which the upper capacitor electrode comprises a stress-reduced layer system.

Then, step 3 for deposition of the capacitor dielectric 14 is carried out as described above (cf. FIG. 8).

Step 4: Formation of the Upper Capacitor Electrode

A tungsten silicide layer 20 is deposited by CVD. The space which remains in the trenches 5 is filled with photoresist and etched back using N$_2$/O$_2$. Tungsten silicide is then etched selectively with respect to Si$_3$N$_4$ and the dielectric layer 14 by anisotropic etching using HCl/Cl$_2$/NF$_3$ in a plasma-enhanced etching process. An upper capacitor electrode 15 comprising tungsten silicide is formed.

Figure 9:
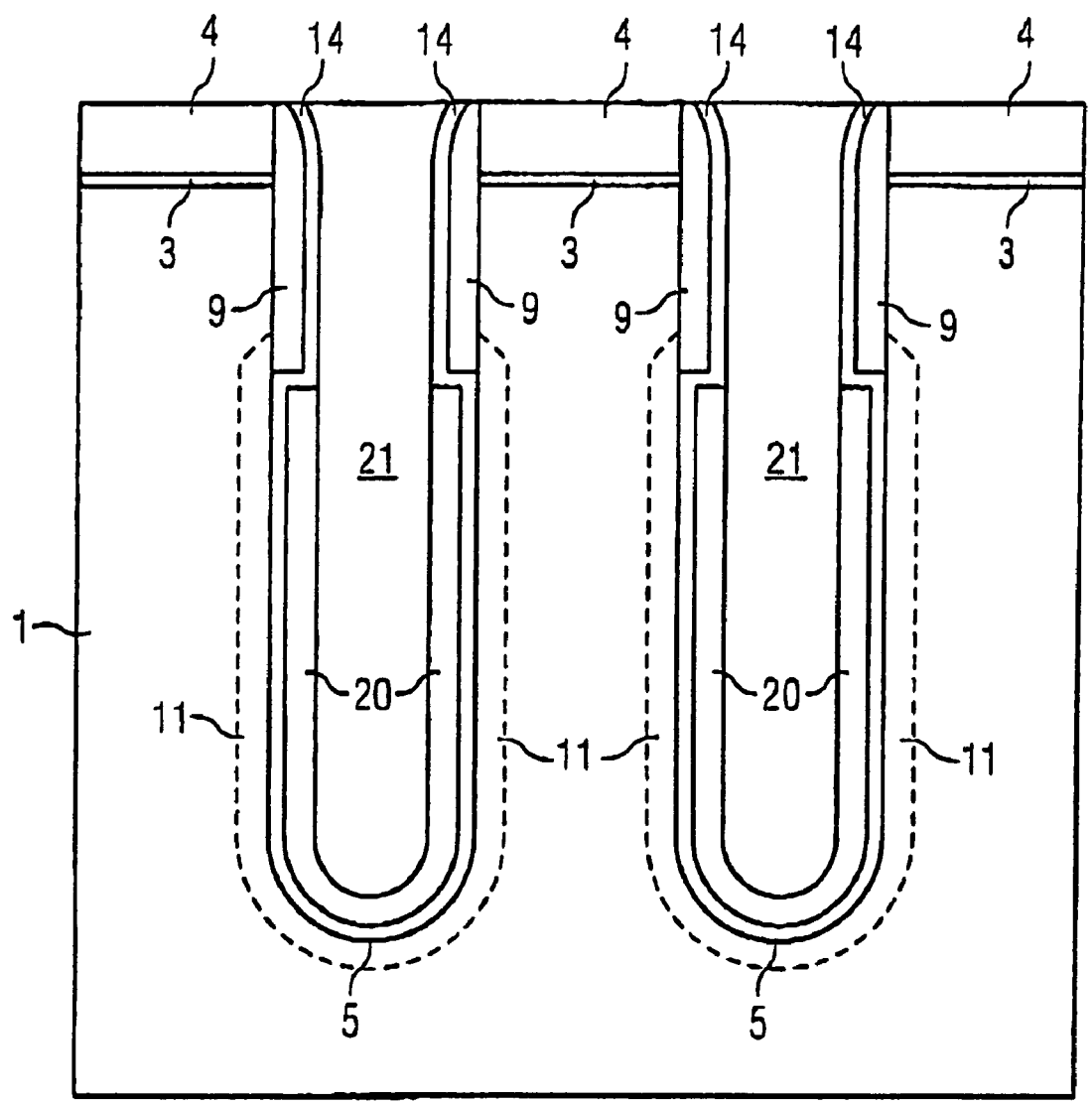

After the removal of the photoresist filling in an etching process using O$_2$/N$_2$, remaining space in the trenches 5 is provided with a SiGe filling 21 by deposition of a 70 nm thick silicon-germanium layer 21, which is doped with arsenic in a concentration of 10$^{20}$ to 10$^{21}$ cm$^{-3}$, and chemical mechanical polishing down to the surface of the Si$_3$N$_4$ layer 4 (cf. FIG. 9). Silicon-germanium can be deposited by a CVD process using silane or disilane and germane. The silicon-germanium layer has a germanium content of 10 to 50%.

Step 5: Connecting the Upper Capacitor Electrode to the Selection Transistor In a dry-etching step using SF$_6$ or HBr, the SiGe filling 21 is etched back 100 nm below the main surface 2. This is followed by an etching step using HF/ethylene glycol, which attacks the Si$_3$N$_4$ and nitride is etched. Uncovered parts of the dielectric layer 14 and of the SiO$_2$ layer 6 are removed with the aid of NH$_4$F/HF. After sacrificial oxidation to form a screen oxide (not shown), an implantation step is carried out, during which an n$^+$-doped region 16 is formed in the side wall of each trench 5, in the region of the main surface 2. Space which remains above the SiGe filling 21 in the respective trench 5 is filled with a SiGe filling 12 by deposition of in-situ doped silicon-germanium and back-etching of the silicon-germanium using SF$_6$ or HBr. In the finished storage capacitor, the SiGe filling 21 acts as an upper capacitor electrode. The silicon-germanium filling 12 acts as a connection structure between the n$^+$-doped region 16 and the silicon-germanium filling 21, which acts as upper capacitor electrode.

Alternatively, it is also possible for a polysilicon filling to be used instead of the silicon-germanium filling 12.

In a procedure in which the insulation collar is formed only after the filling of the capacitor trench and the filling of the capacitor trench takes place in a multistage process, it is also possible, for example, for those parts of the trench filling which adjoin the insulation collar to be formed from polysilicon, while only the lower part of the trench filling is formed from silicon-germanium.

Then, insulation structures 8, which surround the active regions and thereby define these regions, are produced. For this purpose, a mask which defines the active regions is formed (not shown). The insulation structures 8 are completed by nonselective plasma etching of the silicon, SiO$_2$ and silicon-germanium or polysilicon with the aid of CHF$_3$/N$_2$/NF$_3$, with the etching time being set in such a way that 200 nm of silicon-germanium or polysilicon are etched, by removal of the resist mask used by means of O$_2$/N$_2$, by wet chemical etching of 3 nm of dielectric layer, by oxidation and deposition of a 5 nm thick Si$_3$N$_4$ layer and by deposition of a 250 nm thick SiO$_2$ layer using a TEOS process and subsequent chemical mechanical polishing. Then, the Si$_3$N$_4$ layer 4 is removed by etching in hot H$_3$PO$_4$, and the SiO$_2$ layer 3 is removed by etching in dilute hydrofluoric acid.

A screen oxide is then formed by sacrificial oxidation. Photolithographically produced masks and implantations are used to form n-doped wells, p-doped wells and to carry out threshold voltage implantations in the region of the periphery and of the select transistors of the cell array. Furthermore, a high-energy ion implantation is carried out in order to dope the substrate region which is remote from the main surface 2.

In this way, an n$^+$-doped region, which connects adjacent lower capacitor electrodes to one another, is formed (known as a buried well implant).

Figure 10:
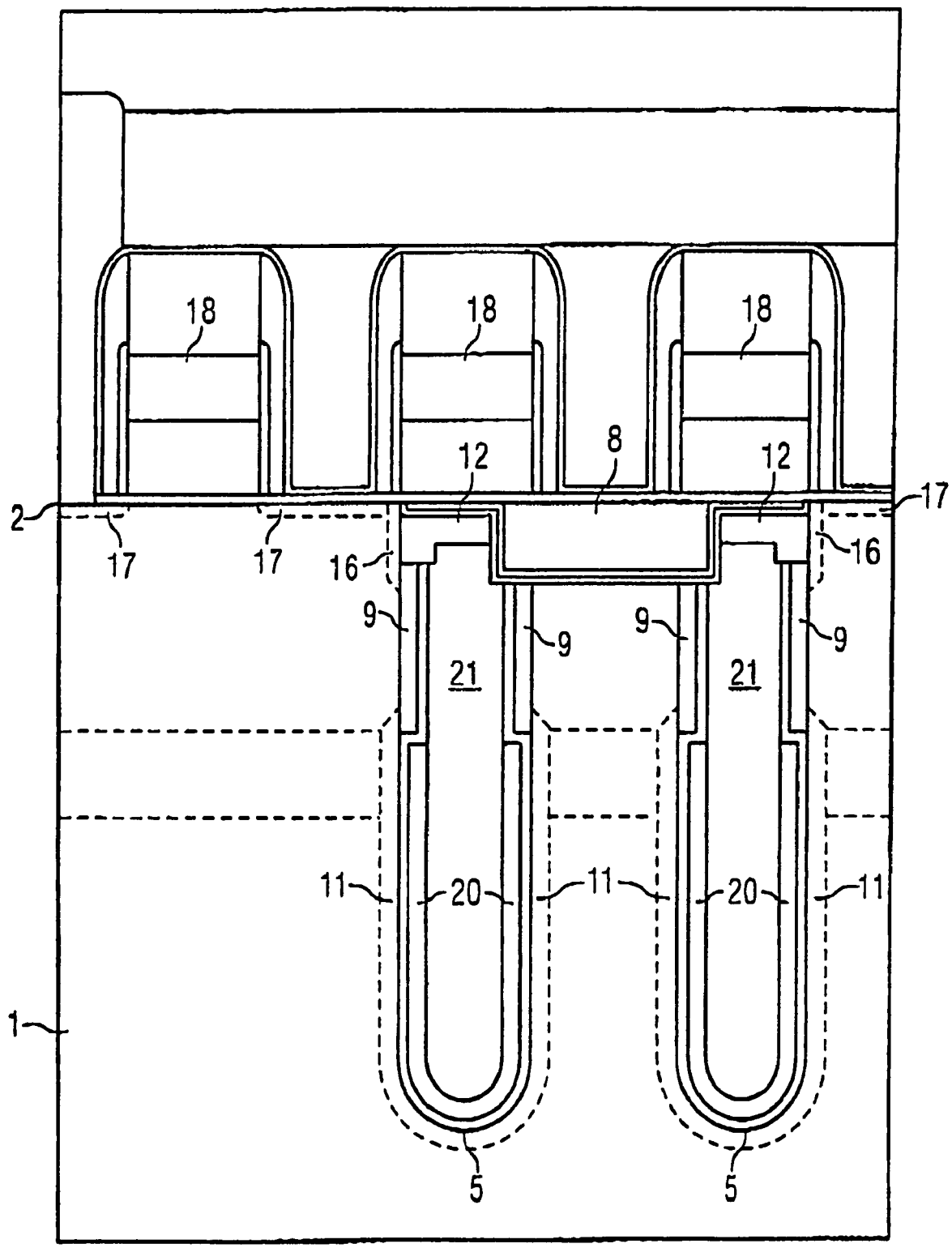

Then, the transistor is completed by generally known method steps, by defining in each case the gate oxide and the gate electrodes 18, corresponding interconnects and the source and drain electrode 17 (cf. FIG. 10).

Then, the memory cell is completed in a known way by forming further wiring levels.

Figure 11:
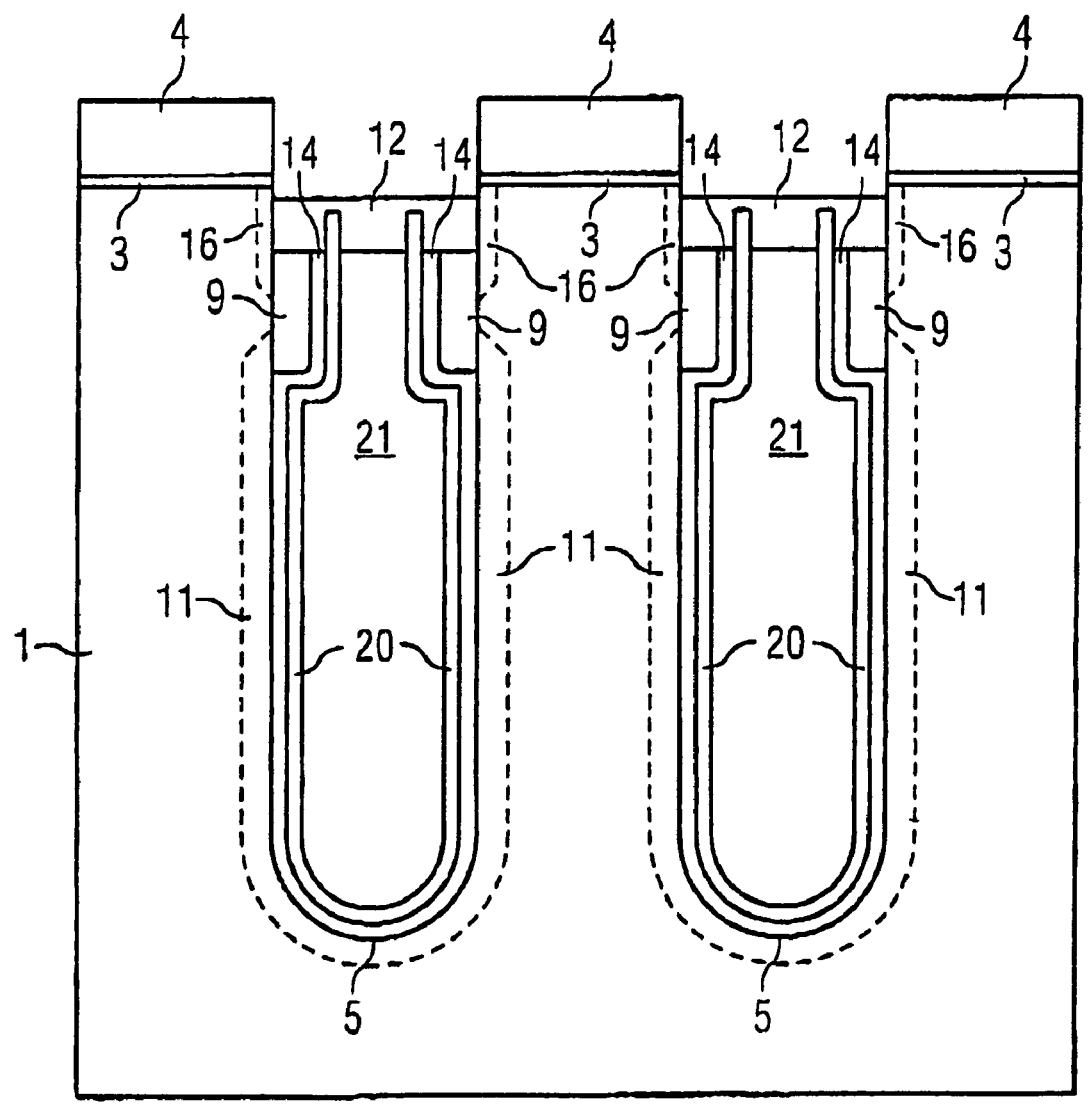
FIG. 11 is a sectional side view showing a variant of the method illustrated in FIGS. 8 to 10.

Alternatively, the upper capacitor electrode may also be produced in the manner illustrated in FIG. 11. For this purpose, first of all the tungsten silicide layer and then the silicon-germanium layer are deposited in the capacitor trench.

The tungsten silicide layer 20, the silicon-germanium layer 21, the SiO$_2$ layer 6 and the dielectric layer 14 are etched back 100 nm below the main surface 2 by chemical mechanical polishing of silicon-germanium and tungsten silicide down to the surface of the Si$_3$N$_4$ layer 4 and subsequent etching using HCl/Cl$_2$/NF$_3$, during which the etching rate of SiO$_2$ and silicon-germanium is higher than that of tungsten silicide. The result is an upper capacitor electrode 20, which projects above the height of the n$^+$-doped region 11, and a silicon-germanium filling 21, which fills up the remaining space in the trench 5 inside the upper capacitor electrode 20. This allows a particularly low-impedance connection of the upper capacitor electrode 20.

The structure of the upper capacitor electrode described in the third embodiment, which comprises a tungsten silicide layer with a doped SiGe filling, is advantageous compared to the known structure of an upper capacitor electrode comprising tungsten silicide layer with doped polysilicon filling, in that the solubility of the dopant in SiGe is greater. As a result, a higher dopant concentration can be achieved in SiGe. This is advantageous firstly because, on account of a higher doping capacity, improved stress matching of the interface between dielectric and tungsten silicide layer can be achieved, and secondly, and also as a result, an increased doping capacity increases the conductivity. Moreover, the conductivity is additionally increased by the fact that the mobility of the charge carriers is higher in SiGe.

Figure 12:
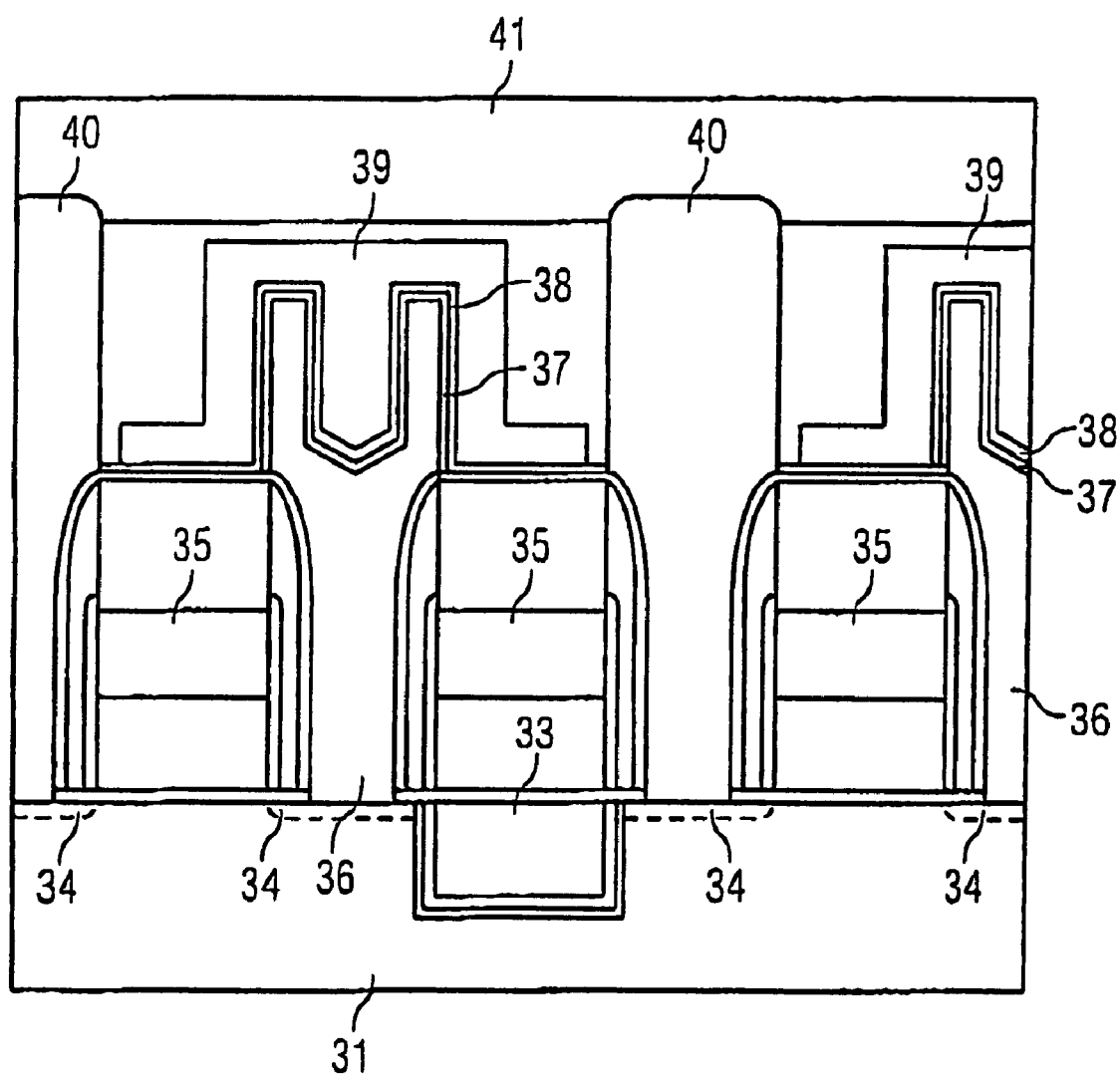
FIG. 12 is a sectional side view of the structure of a memory cell with stacked capacitor, in which the lower capacitor electrode comprises a stress-reduced layer system.

The stress-reduced layer structure comprising doped silicon-germanium, a tungsten silicide layer and storage dielectric may furthermore also advantageously be used in a DRAM memory cell with a stacked capacitor. In FIG. 12, reference numeral 31 denotes a silicon substrate, in which insulation trenches 33 are formed in order to define the active regions, word lines and gate electrodes 35 and also source/drain regions 34. Contact structures 36 are provided in order to connect the source/drain regions 34 to the lower electrode 37 of the stacked capacitors. The stacked capacitors also comprise a capacitor dielectric 38 and an upper capacitor electrode 39. Bit line contacts 40 for connection of the source/drain regions 34 to the bit line are also provided.

In this case, the lower capacitor electrode 37 comprising tungsten silicide is formed on a contact structure 36, which is fabricated from silicon-germanium. Doping the SiGe connection structure with arsenic in a concentration of $10^{20}$ to $10^{21}$ cm$^{-3}$ advantageously minimizes the stress which would otherwise occur between the tungsten silicide layer and the storage dielectric. The silicon-germanium contact structure has a germanium content of 10 to 50%.

We claim:

1. A storage capacitor, comprising:
   a substrate having a trench formed therein, said trench having sidewalls, a bottom, an upper portion and a lower portion;
   a collar disposed at said sidewalls in said upper portion of said trench;
   a lower capacitor electrode;
   a storage dielectric disposed at said sidewalls of said lower portion of said trench, at said bottom of said trench and at said collar in said upper portion of said trench;
   an upper capacitor electrode being a conductive layer disposed at said storage dielectric in said lower portion of said trench, said conductive layer being formed of a material selected from the group consisting of metal silicide, metal nitride, metal carbide, WN, WSiN, WC, TiN, TaN, and TaSiN;
   a doped layer selected from the group consisting of a SiGe layer, a SiC layer, and a GaAs layer or a doped filling selected from the group consisting of a SiGe filling, a SiC filling, and a GaAs filling disposed on a side of said conductive layer remote from said storage dielectric and said doped layer or said doped filling covering said upper capacitor electrode and being disposed at said storage dielectric at said upper portion of said trench;
   said storage dielectric being disposed between said collar and said doped layer or said doped filling in said upper portion of said trench; and
   said doped layer or said doped filling being suitably doped to reduce an interfacial stress between said storage dielectric and said conductive layer.

2. The storage capacitor according to claim 1, configured to form a part of a DRAM memory cell.

3. The storage capacitor according to claim 1, wherein a dopant for said SiGe layer is selected from the group consisting of Al, Ga, In, Tl, B, As, Sb, and P.

4. The storage capacitor according to claim 1, wherein said storage dielectric contains a material selected from the group consisting of silicon nitride, silicon dioxide, silicon oxynitride, metal oxide, aluminum oxide, $Pr_2O_3$, $Nd_2O_3$, $Al_2O_3$ with an addition of Hf, Zr, Y or La.

5. The storage capacitor according to claim 1, wherein said doped layer has a dopant distribution with a gradient.

* * * * *